US009885109B2

(12) United States Patent
Medvedovski et al.

(10) Patent No.: US 9,885,109 B2
(45) Date of Patent: Feb. 6, 2018

(54) ITO CERAMIC SPUTTERING TARGETS WITH REDUCED IN₂O₃ CONTENTS AND METHOD OF PRODUCING IT

(71) Applicant: UMICORE, Brussels (BE)

(72) Inventors: Eugene Medvedovski, Providence, RI (US); Olga Yankov, Coventry, RI (US); Christopher Szepesi, West Warwick, RI (US)

(73) Assignee: Umicore, Brussels (BE)

( * ) Notice: Subject to any disclaimer, the term of this patent is extended or adjusted under 35 U.S.C. 154(b) by 0 days.

(21) Appl. No.: 14/419,692

(22) PCT Filed: Jul. 30, 2013

(86) PCT No.: PCT/EP2013/065992
§ 371 (c)(1),
(2) Date: Feb. 5, 2015

(87) PCT Pub. No.: WO2014/023614
PCT Pub. Date: Feb. 13, 2014

(65) Prior Publication Data
US 2015/0184280 A1    Jul. 2, 2015

Related U.S. Application Data

(60) Provisional application No. 61/680,738, filed on Aug. 8, 2012.

(51) Int. Cl.
C23C 14/34    (2006.01)
C23C 14/08    (2006.01)
(Continued)

(52) U.S. Cl.
CPC ........ *C23C 14/3414* (2013.01); *C04B 35/457* (2013.01); *C04B 35/62645* (2013.01);
(Continued)

(58) Field of Classification Search
None
See application file for complete search history.

(56) References Cited

U.S. PATENT DOCUMENTS

4,962,071 A * 10/1990 Bayard ................. C04B 35/453
106/286.4
5,480,532 A *  1/1996 Schlott ................... C04B 35/01
204/192.29
(Continued)

FOREIGN PATENT DOCUMENTS

EP    2 380 858 A1    10/2011
EP    2380858 A1 * 10/2011    ........... C03C 17/253
(Continued)

OTHER PUBLICATIONS

English text machine translation of Inoue et al. (JP 2009-179515 A1), pp. 1-21.*
(Continued)

*Primary Examiner* — Katie L Hammer
(74) *Attorney, Agent, or Firm* — Brinks Gilson & Lione

(57) ABSTRACT

The embodiments of the invention cover a ceramic sputtering target comprising at least 85 wt. % of an ($In_4Sn_3O_{12}$) phase, wherein the ceramic sputtering target has a density of greater than 7.0 g/cm³. A method of forming an ITO ceramic sputtering target is also described by combining 53 to 65 wt. % of $In_2O_3$ and 35 to 47 wt. % of $SnO_2$ to form a first $In_2O_3/SnO_2$ mixture; mixing and milling the $In_2O_3/SnO_2$ mixture in the presence of water and a dispersing agent until a first slurry is formed, wherein the average particle size of the first slurry is between 0.3-0.7 μm and wherein the specific surface area is between 4-8.5 m²/g; drying the first slurry to form a powder; heat treating the powder at 1300 to 1500° C. to form a compound having an $In_4Sn_3O_{12}$ phase; adding additional $In_2O_3$ and $SnO_2$ to the compound having the $In_4Sn_3O_{12}$ phase thereby forming an In—Sn—O-based
(Continued)

mixture having an atomic In/Sn ratio of 1.33; forming the ITO ceramic sputtering target.

13 Claims, 2 Drawing Sheets

(51) Int. Cl.
| | | |
|---|---|---|
| H01B 1/08 | (2006.01) | |
| C04B 35/457 | (2006.01) | |
| C04B 35/626 | (2006.01) | |
| H01J 37/34 | (2006.01) | |

(52) U.S. Cl.
CPC ............ *C23C 14/086* (2013.01); *H01B 1/08* (2013.01); *H01J 37/3429* (2013.01); *C04B 2235/3232* (2013.01); *C04B 2235/3251* (2013.01); *C04B 2235/3284* (2013.01); *C04B 2235/3286* (2013.01); *C04B 2235/3298* (2013.01); *C04B 2235/3418* (2013.01); *C04B 2235/447* (2013.01); *C04B 2235/5409* (2013.01); *C04B 2235/5445* (2013.01); *C04B 2235/6027* (2013.01); *C04B 2235/6562* (2013.01); *C04B 2235/6583* (2013.01); *C04B 2235/6586* (2013.01); *C04B 2235/77* (2013.01); *C04B 2235/786* (2013.01); *H01J 2237/3322* (2013.01)

(56) References Cited

U.S. PATENT DOCUMENTS

| | | | | |
|---|---|---|---|---|
| 5,700,419 A | * | 12/1997 | Matsunaga | ........... C04B 35/457 264/614 |
| 5,980,815 A | * | 11/1999 | Matsunaga | ............ B02C 19/06 241/5 |
| 6,121,178 A | * | 9/2000 | Eshima | ................. C04B 35/457 204/192.26 |
| 6,187,253 B1 | * | 2/2001 | Schlott | .................. C04B 35/457 204/298.13 |
| 2009/0315001 A1 | * | 12/2009 | Campet | ................. C04B 35/453 252/519.12 |
| 2011/0100809 A1 | * | 5/2011 | Delrue | ................ C23C 14/3414 204/298.13 |

FOREIGN PATENT DOCUMENTS

| | | | |
|---|---|---|---|
| JP | 2009179515 A | * | 8/2009 |
| WO | 2009/020084 A1 | | 2/2009 |
| WO | 2011/044985 A1 | | 4/2011 |

OTHER PUBLICATIONS

O'Neil, David H., et al., "Structural, Optical and Electrical Properties of $In_4Sn_3O_{12}$ Films Prepared by Pulsed Laser Deposition", *Materials Chemistry and Physics*, vol. 123 (2010), pp. 152-159.

Minami, T., et al., "Preparation of Transparent Conducting $In_4Sn_3O_{12}$ Thin Films by DC Magnetron Sputtering", *Thin Solid Films*, vol. 308-309 (1997), pp. 13-18.

Zhou, T., et al., "Enhanced Densification and Thermoelectric Performance of $In_4Sn_3O_{12}$ by Reactive Sintering in the In—Sn—Ga—O System", *J. Am. Ceram. Soc.*, vol. 94, No. 11 (2011), pp. 3733-3737.

International Search Report for PCT/EP2013/065992, dated Oct. 15, 2013.

Fullwood, D., "Percolation in Two-Dimensional Grain Boundary Structures and Polycrystal Property Closures", Brigham Young University, All Theses and Dissertations, Paper 676 (Nov. 2, 2005).

* cited by examiner

ITO CERAMIC SPUTTERING TARGETS WITH REDUCED $IN_2O_3$ CONTENTS AND METHOD OF PRODUCING IT

This application is a National Stage application of International Application No. PCT/EP2013/065992, file Jul. 30, 2013, which claims the benefit of U.S. Provisional Application Ser. No. 61/680,738, filed Aug. 8, 2012.

FIELD OF THE INVENTION

This application generally relates to high quality ceramic sputtering targets, including $In_4Sn_3O_{12}$, which are of interest for optoelectronic applications.

BACKGROUND

Indium tin oxide (ITO) ceramics are used for the manufacture of sputtering targets, which in turn are used to produce transparent conductive thin films for optoelectronic applications, such as thin film photovoltaic cells, flat panel displays, touch panels, architectural and automotive glazing, organic and inorganic LED applications. ITO ceramics with $In_2O_3$ contents of 98-80 wt. % are reliable materials for these applications and provide high quality thin films. However, as the demand for Indium and Indium-based materials has increased, In metal price has also increased. Consequently, ITO sputtering target cost has increased considerably over the last twenty years.

ITO ceramic targets used in vacuum sputtering deposition methods for the formation of high quality transparent conductive oxide (TCO) thin films must generally have high densities. Additionally, conventional ITO thin films, as well as ZnO-based thin films and some other transparent conductive oxide thin films, are not very stable in certain environments, e.g. in resistive touch panels and flexible photovoltaic applications, which may impact their useful lifetime.

ITO ceramics usually consist of $In_2O_3$ (or indium-sesquioxide) grains, where tin partially substitutes indium in the crystalline lattice of $In_2O_3$. When $SnO_2$ content in ITO ceramics is 6 wt. % or greater, a secondary phase, $In_4Sn_3O_{12}$, is also present. The content and grain size of this secondary phase may be defined not only by the $In_2O_3/SnO_2$ ratio, but also by the manufacturing features such as starting materials, process uniformity, firing conditions, and size of the producing ceramic bodies, among others. The content and distribution of this secondary phase may also affect the sputtering stability of the target such as its sensitivity for arcing in a DC process, and, as a result, the film quality and reproducibility.

SUMMARY

The embodiments of the invention cover a ceramic sputtering target comprising at least 85 wt. % of an $In_4Sn_3O_{12}$ phase, wherein the ceramic sputtering target has a density of greater than 7.0 g/cm$^3$. The wt % of the $In_4Sn_3O_{12}$ phase is measured with reference to the total amount of the crystalline phase contained by the target of the invention as identified with a PAD V X-Ray Diffractometer, Scintag, Inc., Sunnyvale, Calif. A Rietveld analysis was used to calculate a pattern best fitting the experimental data.

Some of the embodiments of the invention cover a ceramic sputtering target comprising at least 85 wt. % of an $In_4Sn_3O_{12}$ phase, an oxide additive, and less than 15 wt. % of the combination of $In_2O_3$ and $SnO_2$ phases (complying with an overall In/Sn ratio of 1.33), wherein the ceramic sputtering target has a density of greater than 7.0 g/cm$^3$. The combination of $In_2O_3$ and $SnO_2$ phases was simply determined from the wt fraction of $In_2O_3$ as established by the Rietveld analysis and using XRF data on the ratio In/Sn.

In some embodiments, a ceramic sputtering target is described that includes at least 85 wt. % of an $In_4Sn_3O_{12}$ phase; an oxide additive; and which has an overall atomic ratio of In/Sn of 1.33 (+/−0.01). The In/Sn ratio was determined by XRF using analytical references prepared by mixing pure $In_2O_3$ and $In_4Sn_3O_{12}$.

A method of forming an ITO ceramic sputtering target is described by combining 53 to 65 wt. % of $In_2O_3$ and 35 to 47 wt. % of $SnO_2$ to form a first $In_2O_3/SnO_2$ mixture; mixing and milling the $In_2O_3/SnO_2$ mixture in the presence of water and a dispersing agent until a first slurry is formed, wherein the average particle size of the first slurry is between 0.3-0.7 μm and wherein the specific surface area is between 4-8.5 m$^2$/g; drying the first slurry to form a powder; heat treating the powder at 1300 to 1500° C. to form a compound having an $In_4Sn_3O_{12}$ phase; adding additional $In_2O_3$ and $SnO_2$ to the compound having the $In_4Sn_3O_{12}$ phase thereby forming an In—Sn—O-based mixture having a atomic In/Sn ratio of 1.33; forming the ITO ceramic sputtering target.

Certain oxide additives, which may be introduced to the ceramic sputtering targets without change of the $In_2O_3/SnO_2$ ratio, promote densification of ceramics and reduce the possibility of crack formation associated with high temperature phase transformation of the original $In_2O_3$ and $SnO_2$ into the $In_4Sn_3O_{12}$ phase.

The ceramic sputtering targets and the ceramic compositions based on the embodiments of this invention contain significantly less indium in comparison with conventional ITO ceramics (e.g. approximately 50% of the indium oxide content of the corresponding mass of 90 wt. % $In_2O_3$, 10 wt. % $SnO_2$ ITO composition hereafter referred to as a 90/10 ITO). As a result, the ceramics in accordance with the embodiments of this invention have the potential to be significantly less expensive than conventional ITO targets. The thin films which can be obtained from these $In_4Sn_3O_{12}$ targets may exhibit slightly inferior electrical and optical properties relative to conventional 90/10 ITO, but still could be a good option for many optoelectronic applications.

Further is described a method of forming an ITO ceramic sputtering target by combining $In_2O_3$ and $SnO_2$ to form a first $In_2O_3/SnO_2$ mixture having an In/Sn ratio of 1.33+/−0.01; adding a dispersing agent, drying the first slurry to form a powder; and heat treating the powder and forming the ITO ceramic sputtering target.

Also described is a thin film comprising an In/Sn ratio of 1.33.

DETAILED DESCRIPTION

Figure 1:
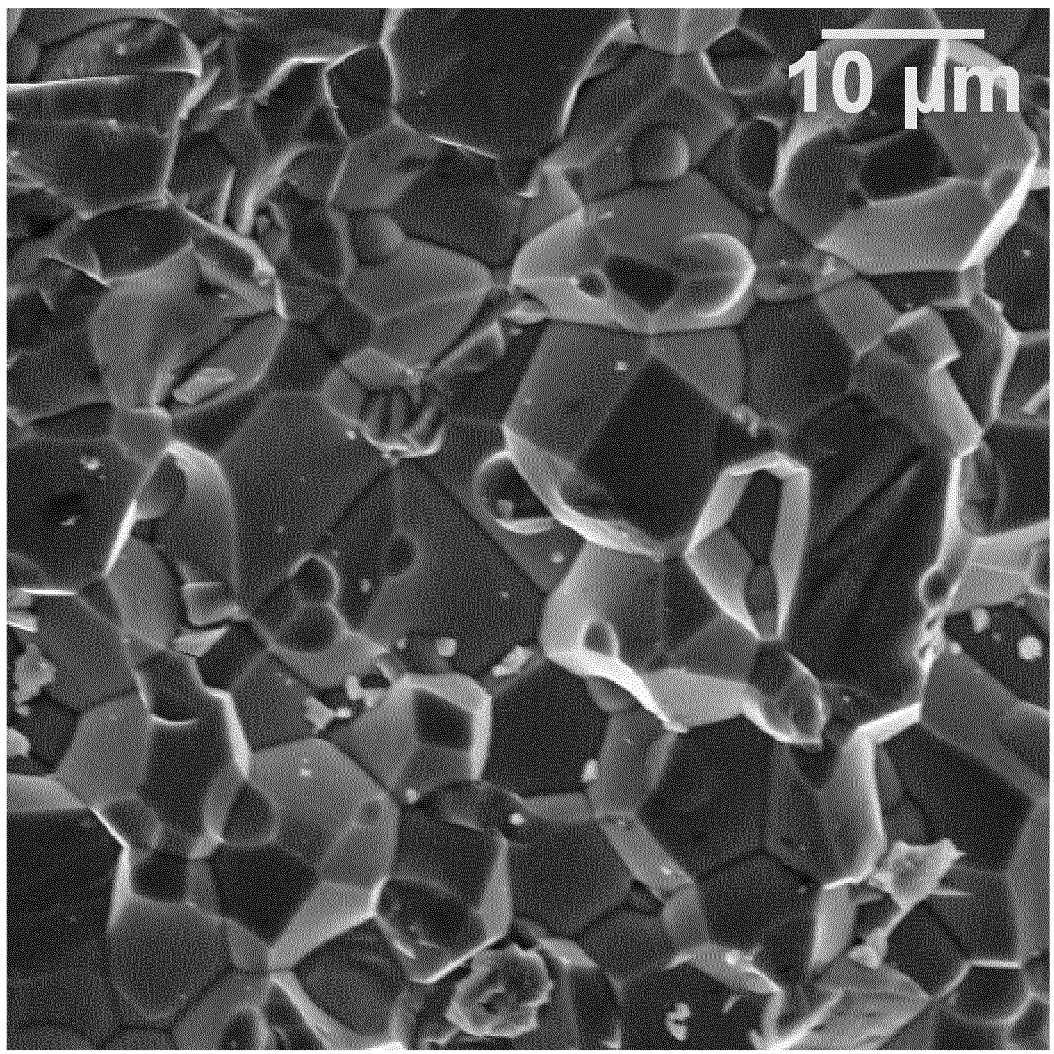
FIG. 1: Image of a ceramic sample according to some embodiments that illustrates uniformity and a very dense microstructure.
Figure 2:
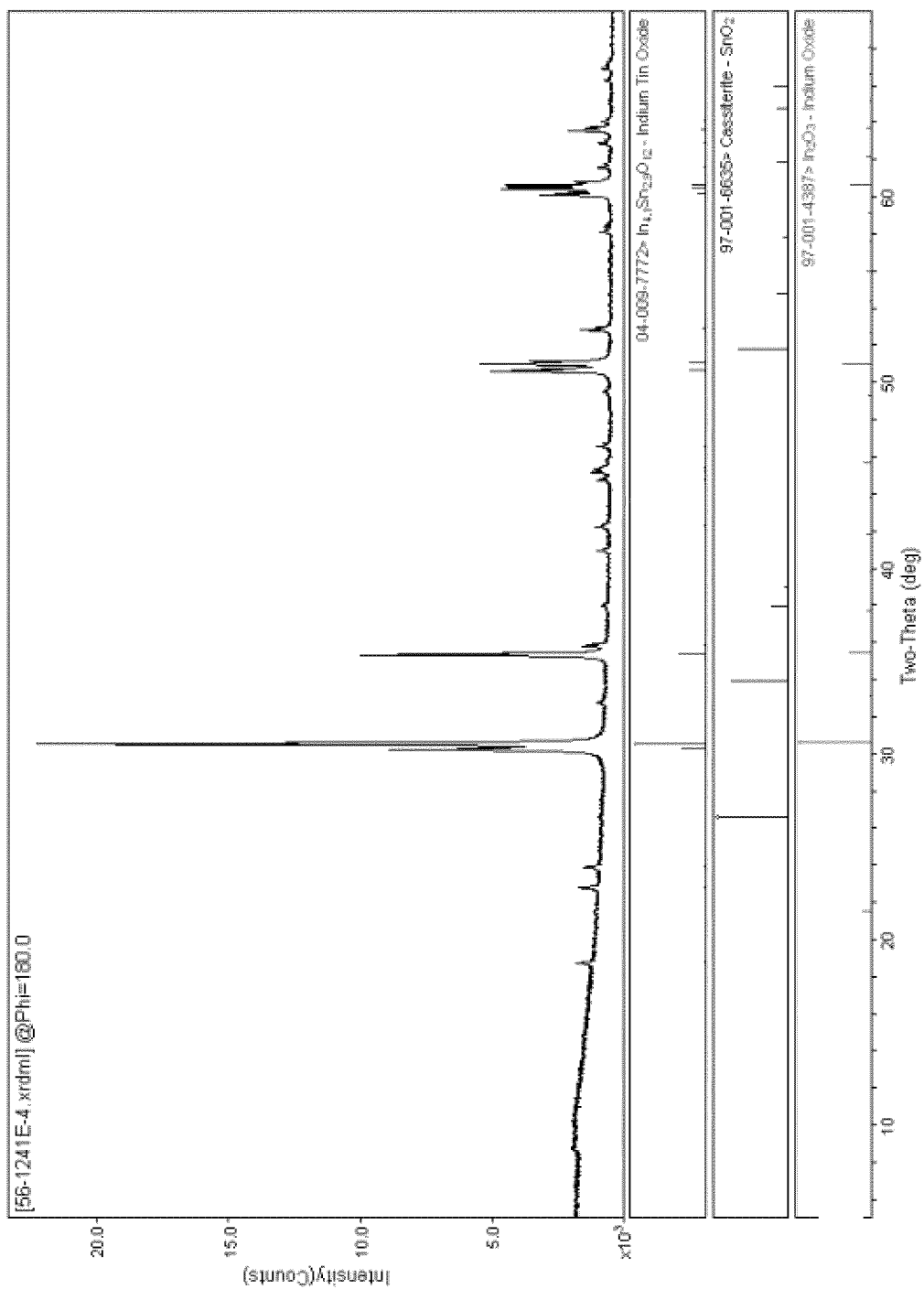
FIG. 2: XRD image of a ceramic sample according to some embodiments that illustrates the presence of the $In_4Sn_3O_{12}$ phase.

Some of the embodiments of the invention relate to ceramic sputtering targets comprising at least about 85% wt. % of an $In_4Sn_3O_{12}$ phase wherein the ceramic sputtering target has a density of greater than 7.0 g/cm$^3$. According to some embodiments, the sputtering target may comprise at least 90 wt. % and/or at least 95 wt. % of the $In_4Sn_3O_{12}$ phase. However, according to some aspects, the amount of $In_4Sn_3O_{12}$ phase may also be greater than 95 wt. %.

In some embodiments, the ceramic sputtering target comprises less than 15 wt. % of the combination of $In_2O_3$ and $SnO_2$ phases.

According to some aspects, the sputtering target may comprise less than about 10 wt. % of the combination of $In_2O_3$ and $SnO_2$ phases.

In some embodiments the ceramic sputtering targets comprise at least about 85 wt. % of an $In_4Sn_3O_{12}$ phase, an oxide additive, and less than about 15 wt. % of the total of $In_2O_3$ and $SnO_2$ phases, but with an overall In/Sn atomic ratio of 1.33, wherein the ceramic sputtering target has a density of greater than 7.0 g/cm$^3$. In other embodiments the In/Sn atomic ratio is 1.33+/−0.01.

According to some aspects, an oxide additive may be included. Examples of some oxide additives that may be used are ZnO, $Nb_2O_5$, $Bi_2O_3$, $ZrO_2$, $Y_2O_3$, $TiO_2$, $CeO_2$, $SiO_2$, $P_2O_5$, $Sb_2O_3$, $HfO_2$, $MoO_3$ and/or CuO. Some embodiments use ZnO, $Nb_2O_5$, $SiO_2$, and/or $P_2O_5$, while other embodiments may utilize $TiO_2$, $Bi_2O_3$, $SiO_2$, and/or $P_2O_5$.

According to some embodiments, one or more oxide additives may be used. The use of small amounts of the selected oxides and their selected combinations may achieve high ceramic densification through liquid phase sintering, reduction of stress formations during the firing-cooling cycle, healing of microcracks which may have formed during the firing-cooling cycle, increased mechanical properties, as well as a high level of electrical properties (e.g. low electrical resistivity). Without wishing to be bound by any particular theory, it is believed that the combination of very small ionic radii such as Si or P with oxides from large ionic radii such as Nb, Ti, Mo, or Hf may give rise to stress relaxation in the final ceramic.

According to some embodiments, the oxide additive may include two or more components. A combination of two or more oxide additives from the selected group may improve ceramic densification through liquid phase sintering. The combination of two or more oxide additives may also reduce stress formations during high temperature ceramic processes and therefore the probability of ceramic cracking. The formation of small amounts of liquid phase due to the use of the selected oxide additives may heal microcracks, which may form during the firing process (i.e. heating-cooling cycle). As a result, thin film processing becomes a more stable process with fewer arcing problems.

In certain embodiments, the oxide additive comprises about 0.01 to about 2.0 wt. %, 0.1 to about 1.8 wt. %, or 0.6 to about 1.5 wt. % of the ceramic sputtering target. For example, the ceramic sputtering target may comprise 0.05 to about 2.0 wt. % of any one of ZnO, $Nb_2O_5$, $Bi_2O_3$, $ZrO_2$, $Y_2O_3$, $TiO_2$, $CeO_2$, $SiO_2$, $P_2O_5$, $Sb_2O_3$, $HfO_2$, $MoO_3$ and CuO. Additionally, the ceramic sputtering target may comprise 0.01 to about 2.0 wt. %, 0.1 to about 1.8 wt. %, or 0.6 to about 1.5 wt. % of any combination of oxide additives from ZnO, $Nb_2O_5$, $Bi_2O_3$, $ZrO_2$, $Y_2O_3$, $TiO_2$, $CeO_2$, $SiO_2$, $P_2O_5$, $Sb_2O_3$, $HfO_2$, $MoO_3$ and CuO.

In other embodiments, the oxide additives may comprise about 0.01 to about 1.2 wt. % of the ceramic sputtering target. For example, the ceramic sputtering target may comprise about 0.01 to about 1.2 wt. % of ZnO, $Nb_2O_5$, $SiO_2$, and $P_2O_5$. In other embodiments, the ceramic sputtering target may comprise about 0.01 to about 1.2 wt. % of any combination of oxide additives from ZnO, $Nb_2O_5$, $SiO_2$, and $P_2O_5$.

According to certain embodiments, the oxide additives may comprise about 0.01 to about 1.5 wt. % of the ceramic sputtering target. For example, the ceramic sputtering target may comprise about 0.01 to about 1.5 wt. % of $TiO_2$, $Bi_2O_3$, $SiO_2$, and $P_2O_5$. In other embodiments, the ceramic sputtering target may comprise about 0.01 to about 1.5 wt. % of any combination of oxide additives from $TiO_2$, $Bi_2O_3$, $SiO_2$, and $P_2O_5$.

According to certain embodiments, the oxide additives may comprise about 0.6 to about 1.5 wt. % of the ceramic sputtering target. For example, the ceramic sputtering target may comprise about 0.6 to about 1.5 wt. % of $TiO_2$, $Bi_2O_3$, $SiO_2$, and $P_2O_5$. In other embodiments, the ceramic sputtering target may comprise about 0.6 to about 1.5 wt. % of any combination of oxide additives from $TiO_2$, $Bi_2O_3$, $SiO_2$, and $P_2O_5$.

In some embodiments, a mixture of oxide additives may comprise about less than 2.0 wt. % of the ceramic sputtering target. The mixture of oxide additives may include mixtures with 10% to 40% of ZnO, 30% to 77% of $Nb_2O_5$, 0% to 15% of $SiO_2$, and 0% to 15% of $P_2O_5$. Alternatively, the mixture of oxide additives includes mixtures with 5% to 60% of $TiO_2$, 20% to 70% of $Bi_2O_3$, 0% to 20% of $SiO_2$, and 0% to 25% of $P_2O_5$.

According to some embodiments, dopants may be utilized which may include two or more components from the group of ZnO, $Nb_2O_5$, $Bi_2O_3$, $ZrO_2$, $Y_2O_3$, $TiO_2$, $CeO_2$, $SiO_2$, $P_2O_5$, $Sb_2O_3$, $HfO_2$, $MoO_3$, CuO taken in the amounts ranging 0.01-2 wt. %, 0.1 to about 1.8 wt. %, or 0.6 to about 1.5 wt. %. Without wishing to be bound by any particular theory, the dopants are believed to lead to ceramic densification through liquid-phase sintering. Furthermore, lower electrical resistivity may be achieved due to slight distortion of the crystalline lattice.

Embodiments utilizing selected dopants or oxide additives may achieve a high yield of crystalline phase $In_4Sn_3O_{12}$ (~85 wt. % or greater) with minimal amounts of residual $In_2O_3$ and $SnO_2$. Additionally, the embodiments may lead to formation of a uniform ceramic structure (grains of 7-15 μm in quantity of 85 wt. % or more, as determined by Lineal Intercept Method—ASTM E 112-96 on SEM micrographs), high ceramic density (>7.1 g/cc), and absence of cracks. Each of these compositions may yield ceramic targets at a lower relative cost due to significant reduction in expensive indium content. Additionally, the high content of the $In_4Sn_3O_{12}$ phase may lead to thin films which are more stable in harsh application environments.

As can be seen in FIG. 1, the microstructural image of a ceramic $In_4Sn_3O_{12}$ composition illustrates a high level of densification with virtually no observable porosity, a highly homogeneous crystalline phase with features consistent with the known rhombohedral structure of $In_4Sn_3O_{12}$, and grain sizes of 7-15 μm. This uniform microstructure may support the formation of high quality thin films while minimizing sputtering problems.

According to some embodiments of the invention, the ceramic sputtering target may be homogenous. In some embodiments, homogenous microstructures may be present and may improve film properties and the sputtering behavior of the target. Additionally, according to some aspects, the ceramic sputtering target may be crack resistant. Without wishing to be bound by any particular theory, it is believed that the absence of cracks may be related to the high yield of the $In_4Sn_3O_{12}$ phase. Transformations from $In_2O_3$ and $SnO_2$, which have cubic and tetragonal crystalline lattices, respectively, to the rhombohedral crystalline lattice of $In_4Sn_3O_{12}$ (and from $In_4Sn_3O_{12}$ to $In_2O_3$ and $SnO_2$ in the case of partial decomposition) may generally lead to cracking. However, in some embodiments it was surprisingly found that the material may be crack resistant. This positive result may be achieved by the preliminary formation (synthesis) of a crystalline $In_4Sn_3O_{12}$ phase.

According to some embodiments, the content of the crystalline $In_4Sn_3O_{12}$ phase may be high. This phase is the only crystalline phase, or alternatively this phase is the major phase with minimal occurrence of residual $In_2O_3$ and $SnO_2$. For example, more than about 80% of the $In_4Sn_3O_{12}$ crystalline phase may include grains that are between about 7 μm and about 15 μm in size.

In other embodiments the grains of the crystalline $In_4Sn_3O_{12}$ phase may be less than 25 μm. When the ceramic contains grains with less than 25 μm, the microstructural uniformity may be higher, which consequently may improve mechanical and thermal properties. Additionally, lower segregation of less conductive impurities in residual pores and grain boundary areas may be observed. More uniform and finer-grain ceramic targets reduce the probability of arcing during sputtering due to lower structural roughness on the submicron level. According to certain embodiments, the uniform microstructure consists predominantly of grains with sizes of 7-15 μm.

In certain embodiments, the ceramic sputtering target may have a bulk electrical resistivity of less than 10 mOhm·cm with the electrical resistivity measured at room temperature. Bulk electrical resistivity may be determined for samples with dimensions of 5×5×25 mm in accordance with ASTM D991. Additionally, an in-line or Van der Pauw-type 4-point probe may be used for evaluating the surface sheet resistance of ground tiles. Both methods may be used for the electrical resistivity measurements.

Some embodiments describe ceramic sputtering targets having a thermal conductivity of 2 to 4 W/m·K measured at 300° C. in accordance with ASTM E 1461.

Without wishing to be bound by any particular theory, it is believed that manufacturing problems such as crack formation, low density, and heterogeneous structure formation may be overcome by the embodiments of the invention. The invention provides for the formation of the $In_4Sn_3O_{12}$ phase and the use of selected oxide additives. These factors together, result in the formation of a dense homogeneous microstructure in the resultant ceramic. The starting materials ($In_2O_3$ and $SnO_2$) and final phase ($In_4Sn_3O_{12}$) have different crystalline lattice structures. For example, $In_2O_3$ has a cubic crystalline lattice, $SnO_2$ has a tetragonal crystalline lattice, and $In_4Sn_3O_{12}$ has a rhombohedral crystalline lattice. Processing of the $In_4Sn_3O_{12}$ ceramic targets without preliminary formation of the desirable $In_4Sn_3O_{12}$ phase may result in the formation of cracks.

Embodiments also describe methods of forming ITO ceramic sputtering targets. In some embodiments about 53 to about 65 wt. % $In_2O_3$ and about 35 to 47 wt. % of $SnO_2$ are combined to produce a first $In_2O_3/SnO_2$ mixture. Alternatively, the $In_2O_3/SnO_2$ mixture may be defined by a ratio In to Sn between 1.86 to 1.13. In some embodiments, the first $In_2O_3/SnO_2$ mixture may be mixed and milled in the presence of water and a dispersing agent until a first slurry is formed. Non-limiting examples of dispersing agents may be polyacrylate-based salts (e.g. ammonium polyacrylate), polyacrylic acid, polyvinylpyrrolidone, and some other water-based compounds.

According to certain aspects, the first slurry contains particles with an average particle size of less than 0.7 μm as measured with a Sedigraph 5100 Particle Size Analyzer, Micrometrics Instrument Corp., Norcross, Ga. According to some embodiments, the average particle size may be about 0.3 μm to about 0.7 μm. According to some aspects, the first slurry contains particles having a specific surface area that is higher than 4 $m^2/g$ as measured with a Gemini 2360 Surface Area Analyzer, Micrometrics Instrument Corp., Norcross, Ga. According to some embodiments, the specific surface area may be about 4 $m^2/g$ to about 8.5 $m^2/g$.

Without wishing to be bound by any particular theory, it is believed that if the particle size is greater than 0.7 μm and if the specific surface area is smaller than 4 $m^2/g$, the synthesis may have to be conducted at higher temperatures. Additionally, longer milling times may be required to attain smaller particles with larger specific surface area. However, at higher temperatures the uniformity of the synthesized material and final ceramic may be lower. If the particle sizes are smaller than 0.3 μm and specific surface area is greater than 8.5 $m^2/g$, the first slip preparation may exhibit processing difficulties (e.g. additional dispersants may be required, etc.).

In some embodiments, the first slurry is dried to produce a powder and then the resulting powder is heat treated at about 1300 to about 1500° C. to form a composition with an $In_4Sn_3O_{12}$ phase. The $In_4Sn_3O_{12}$ phase may be synthesized with a powder made by disintegration of the dried first slurry. Alternatively, so that it will be easier to synthesize the $In_4Sn_3O_{12}$ phase, the disintegrated, dried first slurry may be additionally milled in a dry state using milling equipment of any design to generate a dried aggregate with smaller particle size.

In some embodiments, the $In_2O_3/SnO_2$ mixture is mixed and milled in the presence of water and dispersing agents until a second slurry is formed. According to some aspects, additional $In_2O_3$ and $SnO_2$ may be added to the compound having the $In_4Sn_3O_{12}$ phase thereby forming a second $In_2O_3/SnO_2$ mixture in order to adjust the overall In/Sn ratio to an acceptable level (1.33+/−0.01). Non-limiting examples of dispersing agents may be polyacrylate-based salts (e.g. ammonium polyacrylate), polyacrylic acid, and polyvinylpyrrolidone. According to some embodiments, the average size of particles in the second slurry is between about 0.4 μm and about 1.4 μm. Additionally in certain embodiments, the specific surface area is between about 2 and about 7 $m^2/g$.

According to certain aspects, any suitable method may be applied to form ceramic sputtering targets. Examples of forming methods may include, but are not limited to slip casting, centrifugal casting, pressure filtration, uniaxial and isostatic pressing, injection molding, gel casting, and other methods providing the required shape of the ceramic target. In some embodiments, the ceramic sputtering target is dried and fired at a temperature of about 1450 to about 1600° C. Additionally, according to some aspects, pressure-assisted sintering methods, such as hot pressing, hot isostatic pressing, and/or spark plasma sintering, may be used.

According to some embodiments grinding of the ceramic sputtering target is performed to obtain a smooth surface in order to reduce potential arcing and/or to provide a smooth surface suitable for the sputtering process.

According to some aspects an ITO ceramic sputtering target is produced by combining 53 to 65 wt. % $In_2O_3$ and 35 to 47 wt. % $SnO_2$ to form a first $In_2O_3/SnO_2$ mixture (i.e. with the ratio $In_2O_3/SnO_2$ from 1.86 to 1.13), mixing and milling the first $In_2O_3/SnO_2$ mixture in the presence of water and a dispersing agent until a first slurry is formed, wherein the average particle size of the first slurry is less than 0.7 μm (0.3-0.7 μm) and wherein the specific surface area is higher than 4 m$^2$/g (4-8.5 m$^2$/g), drying the first slurry to form a powder, heat treating the powder at 1300 to 1500° C. to form a compound having an $In_4Sn_3O_{12}$ phase, adding additional $In_2O_3$ and $SnO_2$ to the compound having the $In_4Sn_3O_{12}$ phase thereby forming a second $In_2O_3/SnO_2$ mixture, mixing and milling the second $In_2O_3/SnO_2$ mixture in the presence of water and a dispersing agent until a second slurry is formed, wherein the average particle size of the second slurry is between about 0.4 μm and 1.4 μm and wherein the specific surface area is between 2 and 7 m$^2$/g, and forming the ITO ceramic sputtering target.

According to certain embodiments, the ceramic sputtering target is dried and fired at a temperature of 1450 to 1600° C.

According to some embodiments, ceramic sputtering targets having the $In_4Sn_3O_{12}$ crystalline phase may be produced with a high density, low bulk electrical resistivity, sufficient thermal conductivity, crack-free, and with highly uniform microstructure by using $In_2O_3/SnO_2$ ratios ranging from (53 to 65 wt %)/(47-35 wt %) and with two or more dopants from the group of ZnO, $Nb_2O_5$, $Bi_2O_3$, $ZrO_2$, $Y_2O_3$, $TiO_2$, $CeO_2$, $SiO_2$, $P_2O_5$, $Sb_2O_3$, $HfO_2$, $MoO_3$, CuO, at a level of 0.1-2 wt. %.

According to certain aspects, starting materials may be homogeneously mixed and, if necessary, milled to obtain a first slurry. The first slurry may be dried resulting in a "feedstock" powder that may be heat treated at a temperature of about 1300 to about 1500° C. to form an $In_4Sn_3O_{12}$ phase. The obtained synthesized material is milled and may also be mixed with additional amounts of $In_2O_3$ or $SnO_2$ or both to tune the overall composition closer to the targeted ratio for $In_4Sn_3O_{12}$ formation. This minimizes or avoids the presence of residual oxide phases. During this same milling and mixing, additional dopants may be incorporated in order to prepare a second slurry. Different techniques may be used for shaping the ceramic body including slip casting, pressure filtration, centrifugal casting, uniaxial pressing, cold isostatic pressing, injection molding, gel casting, or other methods, or a combination of one of the mentioned methods with subsequent cold isostatic pressing. The obtained ceramic green body is fired at a temperature of 1450-1600° C. under oxidizing conditions. Additionally, according to some aspects, pressure-assisted sintering methods, such as hot pressing, hot isostatic pressing, and/or spark plasma sintering, may be used.

According to some embodiments, an oxidizing atmosphere is used which is then replaced by a reducing atmosphere. In some embodiments, grinding of the fired body may be conducted to obtain the desired dimensions and surface quality, which are useful for bonding of the sputtering target, and to achieve a smooth surface thereby promoting sputtering with minimal arcing.

The preparation of the ceramic target includes the following process. According to certain embodiments, the first step of the ceramic preparation may include wet colloidal processing. Starting $In_2O_3$ and $SnO_2$ powders may be mixed and milled in a ratio close to or at the stoichiometric ratio in $In_4Sn_3O_{12}$. Milling may be accomplished by different types of equipment, including but not limited to ball mills, attritors, planetary mills, or other units with mixing/milling media (e.g. ceramic media in the case of milling, or polymeric media in the case of starting powders having particles which do not require additional milling but need mixing), or jet mills with subsequent wet milling/slurry preparation. The ceramic slurry includes starting materials in powder form, water and dispersing agents. Dopant additives, such as for example, ZnO, $Nb_2O_5$, $Bi_2O_3$, $ZrO_2$, $Y_2O_3$, $TiO_2$, $CeO_2$, $SiO_2$, $P_2O_5$, $Sb_2O_3$, $HfO_2$, $MoO_3$, and/or CuO may be added in the quantity of 0.01-2 wt. % together with the $In_2O_3$ and $SnO_2$ starting material powders.

Without wishing to be bound by any theory, it is believed that a higher content of dopants may lead to the development of an excessive amount of a glassy phase. The glassy phase may promote grain growth whereby the $In_4Sn_3O_{12}$ grains may dissolve in the glassy phase during the firing process, which in turn may reduce the electrical conductivity of the ceramic which is not desirable for high quality targets and films. According to some embodiments, the prepared slurry (also called a slip or suspension) has an average particle size of 0.3-0.7 μm. According to other embodiments, the prepared slurry contains particles having an average particle size of 0.4-0.6 μm. Additionally, according to some aspects the particles of the prepared slurry have a specific surface area of 4-8.5 m$^2$/g, or 4.5-7 m$^2$/g after the mixing/milling process. The embodiments and the parameters of the starting material powders may provide a high level of homogenization and may increase their reactivity in order to obtain a high yield $In_4Sn_3O_{12}$ phase. Without wishing to be bound by any particular theory, it is believed that if the slip has coarser particles, e.g. if average particle size is larger than 0.7 μm, and specific surface area is smaller than 4 m$^2$/g, then an insufficient quantity of the $In_4Sn_3O_{12}$ phase forms and excessive amounts of residual unincorporated $In_2O_3$ and $SnO_2$ may be found using XRD analysis for phase characterization.

According to certain embodiments, the obtained slurry may be dewatered to provide a dried powder. Dewatering may be performed, for example, by drying the slurry in an oven, by spray drying, or by other drying processes. The dried powder may be subjected to heat treatment in a furnace at temperatures of 1300-1500° C.

According to some embodiments, the dried powder may be heat treated at temperatures of 1370-1450° C. The synthesis of the $In_4Sn_3O_{12}$ compound may be conducted under oxidizing conditions in order to prevent partial decomposition of $In_2O_3$ and $SnO_2$ and volatilization of the decomposition products. The embodiments provide for the formation of an $In_4Sn_3O_{12}$ phase in quantities of about 85% or higher. Without wishing to be bound by any particular theory, it is believed that if the synthesis temperature is lower than 1300° C., the synthesis of $In_4Sn_3O_{12}$ may be incomplete, and high quantities of residual $In_2O_3$ and $SnO_2$ may be observed by XRD. The oxidizing conditions of the synthesis include the use of an oxygen flow of 5-30 liters per minute per kilogram of synthesized material in the furnace. If the synthesis is conducted at reduced oxygen flow or without oxygen some volatilization of the oxides may occur which may reduce process repeatability and the yield of $In_4Sn_3O_{12}$. If the synthesis is conducted at higher oxygen flow, no process improvement may be achieved. Without wishing to be bound by any particular theory, it is believed that temperatures higher than 1500° C. do not promote an increase of $In_4Sn_3O_{12}$ phase formation. Additionally, in cases of higher temperatures (above 1500° C.), the grains of the $In_4Sn_3O_{12}$ phase of the final ceramic may increase in size and the structure may be less homogeneous.

According to some embodiments, the synthesized compound comprises an $In_4Sn_3O_{12}$ crystalline phase which may be processed by wet milling. Additionally, small quantities of $In_2O_3$, $SnO_2$, or one or more oxide additives may be added to the synthesized compound while retaining an In/Sn atomic ratio between 1.86 and 1.13.

Without wishing to be bound by any particular theory, it is believed that if the content of $In_2O_3$ or $SnO_2$ is high, i.e. if the In/Sn ratio deviates from the proposed ratio, larger amounts of residual $In_2O_3$ or $SnO_2$ phases may be observed after firing. The excessive amounts of these single oxides with the presence of sufficient amounts of $In_4Sn_3O_{12}$ may contribute to excessive crack formation and physical properties reduction of the ceramic and thin films (e.g. ITO films with $In_2O_3$ contents of 65-70 wt % do not have low electrical resistivity).

Dopants or additives mentioned above may be added at this step, with the total quantity of these additives in the range of 0.01-2 wt. %. In embodiments where the contents of the dopants are greater than 2 wt. %, an excessive amount of the glassy phase may occur which may promote dissolution of the desired $In_4Sn_3O_{12}$ crystalline phase and lead to reduced homogeneity of the ceramic microstructure. Additionally, electrical resistivity of the ceramic may be increased which may not be desirable. The milling process may be conducted, for example, in a ball mill, attritor or other milling equipment. The milling process may be conducted in the presence of water and dispersing agents. Dispersing agents, for example, salts of polyacrylic acid, polyvinylpyrrolidone, cellulose esters, and/or other additives, may be used in the quantities of 0.2-2 wt. % of the solid content. In some embodiments where the dispersant content is lower than 0.2 wt. %, dispersion may be incomplete leading to slurry viscosities which may be higher than appropriate for colloidal processing. This may result in trapping of air bubbles in the slurry and lower densification of the ceramic. In embodiments where the dispersant content is greater than 2 wt. %, some coagulation of the slurry may occur which reduces the homogeneity of the slurry. This may lead to a higher probability of cracking, an uneven microstructure of the ceramic, and a reduction in final ceramic density.

In some embodiments, the slurry may be milled to an average particle size of 0.4-1.4 µm and a specific surface area of 2-7 $m^2/g$. According to some embodiments with smaller particle sizes and larger specific surfaces areas, it is possible that the obtained slurry is less stable and that the viscosity is too high for processing. This may result in higher cracking rates and elevated reject rates during ceramic processing.

According to some embodiments, coarser or larger particles and particles having a lower specific surface area may lead to slurry settling during processing which results in reduced homogeneity of the ceramic and a reduction in $In_4Sn_3O_{12}$ phase content. Furthermore, sinterability of the ceramic may be lower due to the presence of larger aggregates in the ceramic. This may lead to poorer physical properties than proposed.

According to certain aspects, the forming of the ITO ceramic sputtering targets may be accomplished by slip casting, uniaxial pressing, cold isostatic pressing, pressure filtration, centrifugal casting, injection molding, gel casting or by other methods; the method is selected with respect to the shape of the targets (e.g. discs, tiles and other shapes for planar targets or hollow cylinders for rotary targets); also the formed ceramic body may be subjected to subsequent cold isostatic pressing.

In some embodiments, as in the case of "wet" shaping methods (e.g. slip casting, pressure filtration, centrifugal casting or others), the formed ceramic body is dried, the green (unfired) body is machined in the dry state to the required shape and dimensions, if necessary, and it is fired in a high-temperature furnace.

In some embodiments, firing may be conducted using firing profiles, which depend on the size and shape of the body, as well as on the quantity of the ceramic bodies in the furnace. In any case, the firing profile may include the stages of binder burn-out, heating, pre-sintering, soak at the final temperature, and cooling.

In some embodiments, firing soak temperature may be in the range of about 1450-1600° C. In certain embodiments, the firing soak temperature may be in the range of about 1500-1590° C. In embodiments where the firing temperature is lower than 1450° C., high density of the ceramic may not be achieved. In certain embodiments, when the firing temperature is greater than 1600° C., the ceramic may also not exhibit high density. Moreover, according to embodiments where the firing temperature is greater than 1600° C., elevated volatilization of $In_2O_3$ and $SnO_2$ may occur that may result in a density decrease and a higher level of re-crystallization of the ceramic with reduction of the ceramic homogeneity associated with extensive grain growth.

According to some embodiments, the firing may be conducted under oxidizing conditions starting at temperatures of about 800° C. of the heating stage. Here, oxidizing conditions constitutes an introduction of a flow of oxygen into the furnace. In some embodiments, oxidizing conditions may be maintained during the entire firing. In some embodiments, oxidizing conditions may be maintained until a temperature of 800° C. is reached during the cooling stage. The required oxygen flow is dependent upon both the amount of product which is being fired and the volume of the furnace. Appropriate rates of oxygen flow include 5-30 liters per minute per kilogram of product in the furnace, or 200-700 l/minute for a furnace volume of 0.125-0.35 $m^3$. If firing is conducted without oxygen or at reduced oxygen flow, excessive $In_2O_3$ and $SnO_2$ volatilization may occur, and high density may not be achieved. Low electrical resistivity and the desired thermal conductivity may also not be achieved. An oxygen flow of more than 700 l/minute may not promote further densification, the process becomes more expensive, and the probability of cracking increases. The firing may also be performed with a switch to a reducing atmosphere such as nitrogen, argon, vacuum, or others. The atmosphere may be switched in the middle of the soak, at the end of the soak, or during the cooling stage. The flow of the reducing gas such as nitrogen may be in the range of 100-500 l/min. If conditions are switched from oxidizing to reducing conditions, reducing atmosphere may be maintained during the cooling stage until 800° C. or lower including maintaining reducing conditions throughout the entire cooling stage. If nitrogen is introduced too early in the firing profile such as before the soak or in the beginning of the soak, high density may not be achieved due to excessive volatilization of $In_2O_3$ and $SnO_2$.

According to some embodiments, the synthesized material may be milled together with one or more additives under wet conditions. Using wet milling for the synthesized material with one or more additives, particle sizes of about 1-2 µm may be reached. In some embodiments, the synthesized material may be milled several times under wet conditions and with one or more additives until the desired particle size and specific surface area are reached. Alternatively, in some embodiments, the synthesized material may be milled in dry conditions without the addition of additives. However, the milled material may then be subjected to wet milling.

According to some aspects, fired ceramic bodies may be inspected and subjected to grinding using diamond tooling or similar methods to obtain the desired dimensions and surface quality that is necessary for bonding and sputtering. Average surface roughness ($R_a$) after grinding may be 1.5 µm or lower as measured with an SJ-400 Surface Roughness Tester, Mitutoyo Corp., Aurora, Ill.

In some embodiments, the ceramic sputtering targets may be used, for example, in large area coatings deposition processes for flat panel displays, thin-film electroluminescent display devices, touch panels, architectural and automotive glazing, and thin film photovoltaic devices. Additionally, these ceramics may have a potential for high temperature thermoelectrics. In comparison with films derived from conventional ITO targets, the thin film compositions according to some embodiments may exhibit an improved yield, lower production costs, and increased stability in harsh environments such as in the presence of elevated moisture levels.

The embodiments of the invention may also lead to the formation of thin films. In some embodiments, the thin films obtained when sputtering the described targets may have a composition equal to or near an In/Sn atomic ratio of 1.33+/−0.01, that of the semiconductor, $In_4Sn_3O_{12}$. Therefore the invention also relates to a thin film comprising $In_2O_3$ and $Sn_2O$, wherein the overall atomic ratio In/Sn is 1.33+/−0.01 said film preferably comprising at least 85% of an $In_4Sn_3O_{12}$ phase. Additionally, the thin films may have electrical properties approaching those of conventional ITO thin films obtained by sputtering 90/10 ITO targets.

According to some embodiments, the thin films may be obtained using different sputtering deposition techniques, including DC magnetron sputtering. Sputtering parameters are selected based on the electrical properties of the ceramic sputtering targets. DC magnetron sputtering deposition may be conducted at a power of 1-3 W/cm$^2$, sputtering pressures of 0.1-0.5 Pa, a gas of Ar containing 2-5 vol % $O_2$, conventional substrates such as Corning's 7059 glass, either at room temperature or preheated up to 300-350° C. Films with a thickness of 100-300 nm, an electrical resistivity in the range of 2-4×10$^{-4}$ Ohm·cm, and an optical transmittance in the visible range of the solar spectrum ($T_{VIS}$) of greater than 80% are deposited at sputtering pressures of 0.2 Pa using a gas flow of Ar containing 4 vol. % $O_2$ and a substrate preheated to 350° C. These properties may be well suited for a range of different optoelectronic applications.

The different embodiments of the invention are described by the following examples. However, the present invention is not limited to the described exemplary embodiments. These examples are for illustrative purpose only.

Example 1

$In_2O_3$ and $SnO_2$ powders having a weight ratio of 56:44 were mixed and milled in an attritor with zirconia grinding media, water, and a dispersing agent. ZnO, $Nb_2O_5$, $SiO_2$ and $Sn_2P_2O_7$ were added in the respective quantities of 0.1, 0.4, 0.025 and 0.075 wt. % relative to the combined weight of $In_2O_3$ and $SnO_2$. A slurry was obtained having an average particle size of 0.5 µm and a specific surface area of 6.0 m$^2$/g. This slurry was dried in an oven with drying pans, and the dried cake was crushed and disintegrated to obtain a powder. The obtained powder was heat treated in a furnace at 1400° C. with a heating ramp of 100° C./hr including a soak at 1400° C. for 3 hours under oxidizing conditions at an oxygen flow 30 l/min/kg of synthesized material. The synthesized powder contained about 85-90% of the $In_4Sn_3O_{12}$ phase as estimated by XRD analysis. The synthesized material and additional $In_2O_3$ was then milled in an attritor at a ratio of 95:5 wt. %.

Additional dopant oxides were added during the milling of the synthesized $In_4Sn_3O_{12}$ and $In_2O_3$, in the amounts of 0.1 wt. % ZnO, 0.4 wt. % $Nb_2O_5$, 0.025 wt. % $SiO_2$, and 0.075 wt. % $Sn_2P_2O_7$ relative to the synthesized $In_4Sn_3O_{12}$ and $In_2O_3$. The batch was mixed and milled with zirconia grinding media in water with addition of dispersing agent. The average particle size for the obtained slurry was 1.05 µm and the specific surface area was 3.4 m$^2$/g. The ITO ceramic green body with a disc shape was formed by slip casting. The obtained green body was dried gradually to a moisture content of <0.5% and then fired in an electric furnace using a profile consisting of a heating ramp of 25° C./hr from room temperature to 650° C., 30° C./hr from 650° C. to 1150° C., 20° C./hr from 1150° C. to 1545° C., soaking at 1545° C. for 15 hrs, then cooling with a ramp of 25° C./hr to 1200° C., 50° C./hr to 800° C., after which the power was shut off. Firing was conducted using oxidizing conditions with an oxygen flow of 50 l/min/kg of the ceramic in the furnace during the entire firing.

Upon analysis, it was found that the fired disc (8 inch in diameter and 10 mm in thickness) did not have any cracks or defects. The density after firing was determined using the water-displacement method in accordance with ASTM B 962-08 and Archimedes law and was found to be 7.22 g/cc. As determined by microstructural analysis on cross sections in an SEM, 85% of the grains in the ceramic sample was about 7-12 µm with grains up to 15 µm in size. According to XRD analysis, the ceramic contained $In_4Sn_3O_{12}$ as the major phase (about 85-90%) with a small amount of $In_2O_3$. Due to their overlapping, a few very small peaks on the diffractogram may be inherent to either $In_4Sn_3O_{12}$ or $In_2O_3$. No other phases were detected. The disc was ground using diamond tooling and the average surface roughness (Ra) determined to be about 1 µm. Average bulk electrical resistivity for samples with dimensions of 5×5×25 mm was 4.5 mOhm·cm as measured in accordance with ASTM D991. Thermal conductivity of ceramic samples ranged from 2.6-2.8 W/m·K. Surface electrical resistivity of the ground sample, measured at room temperature using an in-line 4-point probe was 6 mOhm·cm. For surface electrical resistivity measurements, a Hewlett-Packard Model 6177B DC Current Source device and a Data Precision DP-100 Multimeter were used. The probe spacing was 7.0 mm. The current source was set to 500 mA.

Example 2

$In_2O_3$ and $SnO_2$ powders having a weight ratio of 56:44 were mixed and milled in an attritor with zirconia grinding media, water, and a dispersing agent. $TiO_2$, $Bi_2O_3$, $SiO_2$, and $Sn_2P_2O_7$ were added to the attritor in the respective quantities of 0.25, 0.2, 0.025 and 0.075 wt. %. A slurry was obtained having an average particle size of 0.45 µm and a specific surface area of 6.2 m$^2$/g. The slurry was dried in an oven with drying pans and the dried cake was crushed and disintegrated to obtain a powder. The obtained powder was heat treated in a furnace at 1420° C. with a heating ramp of 100° C./hr including a soak at 1420° C. for 3 hours under oxidizing conditions and an oxygen flow of 30 l/min/kg of synthesized material. The synthesized powder contained about 85-90% of the $In_4Sn_3O_{12}$ phase in accordance with XRD analysis. The synthesized material and additional $In_2O_3$ was then milled in an attritor at a ratio of 96:4 wt. % with incorporation of additional $TiO_2$, $Bi_2O_3$, $SiO_2$, and $Sn_2P_2O_7$ in the amounts of 0.15 wt. % $TiO_2$, 0.1 wt. % $Bi_2O_3$, 0.025 wt. % $SiO_2$, and 0.075 wt. % $Sn_2P_2O_7$. The materials were milled in water with a dispersant additive using zirconia grinding media yielding a slurry with average particle size of 1.1 μm and a specific surface area of 3.0 $m^2/g$.

An ITO ceramic green body with a disc shape was formed by pressure filtration. The obtained green body was dried gradually to a moisture content of <0.5% and then fired in an electric furnace under the same conditions as Example 1.

Upon analysis, it was found that the fired disc (8 inch in diameter and 8 mm in thickness) did not have any cracks or defects. The density after firing was found to be 7.18 g/cc. 85% of the grains in the ceramic sample were about 7-12 μm, with grains up to 15 μm in size. $In_4Sn_3O_{12}$ was found to be the major phase (about 85-90%) with a small amount of $In_2O_3$. No other phases were detected. Average surface roughness (Ra) was about 1 μm. Surface electrical resistivity of the ground sample was 5 mOhm·cm. Bulk electrical resistivity was 4.3 mOhm·cm. Thermal conductivity was 2.8-3.0 W/m·K.

It was found that the properties of samples based on Examples 1 and 2 were useful in a DC magnetron sputtering process, as well as with some other thin film deposition technologies requiring sputtering targets, resulting in the formation of thin films of about 100 nm thickness and exhibiting semiconducting properties suitable for optoelectronic and photovoltaic applications. Without wishing to be bound by any particular theory, it is believed that the particular chemical and phase compositions and microstructures are achieved with the compositions according to the embodiments, and by following the method for ceramic preparation according to the embodiments. The presence of small amounts of the oxide additives promotes the densification of the ITO ceramic and healing of microcracks which may occur during firing of ceramics with the $In_4Sn_3O_{12}$ composition. Furthermore, the oxide additives may be partially inserted into the crystalline lattice of the $In_4Sn_3O_{12}$ promoting electrical conductivity of the ceramic.

Comparative Example 1

$In_2O_3$ and $SnO_2$ powders having a weight ratio of 56:44 were mixed and milled in an attritor with zirconia grinding media, water and a dispersing agent. ZnO, $Nb_2O_5$, $SiO_2$ and $Sn_2P_2O_7$ were added in the respective quantities of 0.1, 0.4, 0.025 and 0.075 wt. %. A slurry was obtained having an average particle size of 0.55 μm and a specific surface area of 6.0 $m^2/g$.

An ITO ceramic green body with a disc shape was formed by slip casting without a preliminary synthesis. The obtained green body was dried gradually to a moisture content of <0.5% and then fired in an electric furnace. A firing profile was conducted using a heating ramp and oxygen flow as in Example 1.

Upon analysis, it was found that the fired disc (8 inch in diameter and 10 mm in thickness) had cracks randomly distributed through the disc. The density after firing was found to be 6.62 g/cc. The majority of the grains in the ceramic samples were about 3-12 μm with grains up to 15 μm in size. $In_4Sn_3O_{12}$ was the major phase (about 65-70%) with small amounts of $In_2O_3$ and $SnO_2$. The disc was ground to an average surface roughness ($R_a$) of about 1 μm, but was largely unusable due to the presence of cracks in the fired body. The surface electrical resistivity of fragments of the ground disc was 56 mOhm·cm. The bulk electrical resistivity of the sample was 48 mOhm·cm. The thermal conductivity of the ceramic sample was 1.6-1.8 W/m·K.

Based on the obtained data, the disc sample is not suitable for use as a sputtering target due to the presence of the cracks whose formation may be related to the high temperature phase transformation of the starting ingredients during firing. The density of the sample was not high. The structural uniformity was low due to the presence of $In_2O_3$ and $SnO_2$ phases within with $In_4Sn_3O_{12}$. Electrical resistivity was much higher, with values potentially inconsistent due to the presence of porosity and cracks. Because of these issues, it is not expected that sputtered thin films would have acceptable properties, and severe arcing of the target and nodule formation is likely, resulting in an inefficient sputtering process.

Comparative Example 2

$In_2O_3$ and $SnO_2$ powders having a weight ratio of 56:44 were mixed and milled in an attritor with zirconia grinding media, water, and a dispersing agent. A slurry was obtained having an average particle size of 0.45 μm and a specific surface area of 6.3 $m^2/g$. The slurry was dried in an oven with drying pans, and the dried cake was crushed and disintegrated to obtain a powder. The obtained powder was heat treated in a furnace at 1400° C. with a heating ramp of 100° C./hr including a soak at 1400° C. for 3 hours under oxidizing conditions at an oxygen flow of 30 l/min/kg of the synthesized material. The synthesized powder contained about 90% of the $In_4Sn_3O_{12}$ phase as estimated by XRD analysis.

The synthesized material and additional $In_2O_3$ was milled in attritor at a ratio of 95:5 wt. %. The batch was mixed and milled with zirconia grinding media in water with addition of dispersing agent. The average particle size for the obtained slurry was 0.95 μm and the specific surface area was 3.6 $m^2/g$. An ITO ceramic green body with a disc shape was formed by slip casting. The obtained green body was dried gradually to a moisture content of <0.5% and then fired in an electric furnace using a heating ramp and oxygen flow as in Example 1.

Upon analysis, it was found that the fired disc (8 inch in diameter and 10 mm in thickness) had a few minor cracks. The density after firing was found to be 6.48 g/cc. ~85% of the grains in the ceramic sample were about 7-12 μm with grains up to 15 μm in size. The ceramic contained $In_4Sn_3O_{12}$ as the major phase (about 85-90%) with a small amount of $In_2O_3$. No other phases were detected. The disc was ground to an average surface roughness ($R_a$) of about 1 μm. A few small cracks were observed. The surface electrical resistivity of the ground sample was 46 mOhm·cm. The bulk electrical resistivity was 42 mOhm·cm. The thermal conductivity of the ceramic sample was 1.8-2.0 W/m·K.

Based on the obtained data, the disc sample is not well suited for use as a sputtering target due to the presence of the microcracks. The density of the sample was not high. The electrical resistivity was high, but its value may not be very consistent due to the presence of porosity and microcracks. Because of these issues, it is not expected that sputter deposited thin films will have acceptable properties, and arcing and nodule formation is anticipated during sputtering.

Comparative Example 3

$In_2O_3$ and $SnO_2$ powders having a weight ratio of 56:44 were mixed and milled in an attritor with zirconia grinding media, water, and a dispersing agent. ZnO, $Nb_2O_5$, $SiO_2$, and $Sn_2P_2O_7$ were added in the respective quantities of 0.1, 0.4, 0.025 and 0.075 wt. % A slurry was obtained having an average particle size of 0.48 μm and a specific surface area of 6.1 $m^2/g$. The slurry was dried in an oven with drying pans, and the dried cake was crushed and disintegrated to obtain a powder. The obtained powder was heat treated in a furnace at 1250° C. with a heating ramp of 100° C./hr including a soak at 1250° C. for 3 hours under oxidizing conditions at an oxygen flow of 30 l/min/kg of the synthesized material. The synthesized powder contained a mix of phases including $In_4Sn_3O_{12}$, $In_2O_3$ and $SnO_2$. $In_2O_3$ and $SnO_2$ phases were present in significant quantities.

The synthesized material and additional $In_2O_3$ was milled in an attritor at a ratio of 95:5 wt. %. ZnO, $Nb_2O_5$, $SiO_2$ and $Sn_2P_2O_7$ were added to this mix in the amounts 0.05 wt. % ZnO, 0.1 wt. % $Nb_2O_5$, 0.025 wt. % $SiO_2$, and 0.075 wt. %. The batch was mixed and milled with zirconia grinding media in water with addition of dispersing agent. The average particle size for the obtained slurry was 1.05 µm with a specific surface area of 3.4 m²/g. An ITO ceramic green body with a disc shape was formed by cold isostatic pressing at 300 MPa from a spray dried and granulated powder. The obtained green body was fired in an electric furnace under the same conditions as Example 1.

Upon analysis, it was found that the fired disc (8 inch in diameter and 10 mm in thickness) had a few minor cracks. The density after firing was found to be 6.96 g/cc. ~75-80% of the grains in the ceramic sample was about 3-15 µm in size. $In_4Sn_3O_{12}$ was the major phase (about 65-70%) with some residual $In_2O_3$ and a minor amount of $SnO_2$. The disc was ground to an average surface roughness ($R_a$) of about 1 µm. The cracks within the disc became more visible after grinding. Surface electrical resistivity was 33 mOhm·cm. The bulk electrical resistivity was 28 mOhm·cm. The thermal conductivity of the ceramic sample was 2.0-2.2 W/m·K.

Based on the obtained data, the disc sample was not well suited for use as a sputtering target due to the presence of the microcracks, which originated due to the high temperature phase transformation. The synthesis of the $In_4Sn_3O_{12}$ was incomplete, potentially due to a less than preferred amount of additive. Density of the sample was not high. The electrical resistivity was high, but its value may not be very consistent due to the presence of porosity and microcracks. Because of these issues, it is not expected that sputter deposited thin films will have acceptable properties, and arcing and nodule formation is anticipated during sputtering.

The invention claimed is:

1. A ceramic body for a sputtering target comprising an $In_4Sn_3O_{12}$ phase, wherein the $In_4Sn_3O_{12}$ phase accounts for at least 85 wt. % of the body, wherein the ceramic body has a density of greater than 7.0 g/cm³, and wherein the $In_4Sn_3O_{12}$ phase consists of grains and more than about 80% of the grains of the $In_4Sn_3O_{12}$ phase are 7 µm to 15 µm in size.

2. The ceramic body of claim 1, further comprising less than 15 wt. % of a combination of $In_2O_3$ and $SnO_2$ phases.

3. The ceramic body of claim 1, further comprising an oxide additive.

4. The ceramic body of claim 3, wherein the oxide additive comprises ZnO, $Nb_2O_5$, $SiO_2$, $P_2O_5$, $Bi_2O_3$, $TiO_2$, or combinations thereof.

5. The ceramic body of claim 1, wherein the ceramic body is crack-free after manufacturing and resists high power load DC magnetron sputtering without cracking.

6. A method of forming the ceramic body of claim 1, comprising:
 a. combining 53 to 65 wt. % of $In_2O_3$ and 35 to 47 wt. % of $SnO_2$ to form a first $In_2O_3/SnO_2$ mixture;
 b. mixing and milling the first $In_2O_3/SnO_2$ mixture in the presence of water and a dispersing agent until a first slurry is formed, wherein the average particle size of the first slurry is between 0.3-0.7 µm and wherein the specific surface area is between 4-8.5 m2/g;
 c. drying the first slurry to form a powder;
 d. heat treating the powder at 1300 to 1500°C. to form a compound having an $In_4Sn_3O_{12}$ phase;
 e. adding additional $In_2O_3$ and $SnO_2$ as a second $In_2O_3/SnO_2$ mixture to the compound having the $In_4Sn_3O_{12}$ phase thereby producing an In-Sn-O-based mixture having a atomic In/Sn ratio of 1.33; and
 f. forming and firing the indium tin oxide (ITO) ceramic sputtering target.

7. The method according to claim 6, further comprising adding an oxide additive comprising two or more components.

8. The method according to claim 7, wherein the two or more components of the oxide additive comprise about 0.01 to about 2 wt. % of the ITO ceramic sputtering target and are selected from the group consisting of ZnO, $Nb_2O_5$, $Bi_2O_3$, $ZrO_2$, $Y_2O_3$, $TiO_2$, $CeO_2$, $SiO_2$, $P_2O_5$, $Sb_2O_3$, $HfO_2$, $MoO_3$, and CuO.

9. The method according to claim 6, further comprising adding an oxide additive to the first $In_2O_3/SnO_2$ mixture and/or to the second $In_2O_3/SnO_2$ mixture.

10. The method according to claim 6, wherein mixing and milling the first $In_2O_3/SnO_2$ mixture comprises mixing and milling the first $In_2O_3/SnO_2$ mixture until a homogeneous first slurry is formed.

11. The method according to claim 6, wherein the formation of the compound having an $In_4Sn_3O_{12}$ phase from the 53 to 65 wt. % of $In_2O_3$ and 35 to 47 wt. % of $SnO_2$ is performed with oxidizing conditions.

12. The method according to claim 6, further comprising milling the second $In_2O_3/SnO_2$ mixture in the presence of water and a dispersing agent until a particle size of about 1-2 µm is achieved.

13. The method according to claim 6, further comprising adding additional $In_2O_3$ and $SnO_2$ to the compound having the $In_4Sn_3O_{12}$ phase thereby adjusting the ratio of In/Sn to 1.33+/-0.01.

* * * * *